US012322579B2

(12) United States Patent
Long et al.

(10) Patent No.: US 12,322,579 B2
(45) Date of Patent: *Jun. 3, 2025

(54) METAL CONTAMINATION REDUCTION IN SUBSTRATE PROCESSING SYSTEMS WITH TRANSFORMER COUPLED PLASMA

(71) Applicant: Lam Research Corporation, Fremont, CA (US)

(72) Inventors: Maolin Long, Santa Clara, CA (US); Neema Rastgar, San Jose, CA (US); Alexander Miller Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 825 days.

This patent is subject to a terminal disclaimer.

(21) Appl. No.: 17/363,870

(22) Filed: Jun. 30, 2021

(65) Prior Publication Data
US 2021/0327689 A1 Oct. 21, 2021

Related U.S. Application Data

(62) Division of application No. 16/238,926, filed on Jan. 3, 2019, now Pat. No. 11,056,321.

(51) Int. Cl.
*H01L 21/306* (2006.01)
*H01J 37/32* (2006.01)
*H01L 21/67* (2006.01)
*H01L 21/683* (2006.01)

(52) U.S. Cl.
CPC ...... *H01J 37/32871* (2013.01); *H01J 37/321* (2013.01); *H01J 37/3211* (2013.01); *H01J 37/32119* (2013.01); *H01J 37/32449* (2013.01); *H01J 37/32651* (2013.01); *H01L 21/67069* (2013.01); *H01J 2237/334* (2013.01); *H01L 21/6831* (2013.01)

(58) Field of Classification Search
CPC .............. H01J 37/321; H01J 37/3211; H01J 37/32119; H01J 37/32651; H01J 37/32871; H05H 1/4652
See application file for complete search history.

(56) References Cited

U.S. PATENT DOCUMENTS

| | | | |
|---|---|---|---|
| 2011/0297320 A1* | 12/2011 | Sakka | H01J 37/3211 156/345.48 |
| 2012/0223060 A1* | 9/2012 | Yamazawa | H05H 1/46 219/121.43 |
| 2012/0273130 A1* | 11/2012 | Drewery | H01J 37/32651 361/816 |
| 2015/0235810 A1* | 8/2015 | Long | H01J 37/32651 315/111.21 |

* cited by examiner

Primary Examiner — Luz L Alejandro Mulero
(74) Attorney, Agent, or Firm — PENILLA IP, APC (57) ABSTRACT

A substrate processing system includes a processing chamber including a substrate support to support a substrate. A coil includes at least one terminal. An RF source configured to supply RF power to the coil. A dielectric window is arranged on one surface of the processing chamber adjacent to the coil. A contamination reducer includes a first plate that is arranged between the at least one terminal of the coil and the dielectric window.

12 Claims, 6 Drawing Sheets

FIG. 6

METAL CONTAMINATION REDUCTION IN SUBSTRATE PROCESSING SYSTEMS WITH TRANSFORMER COUPLED PLASMA

CLAIM OF PRIORITY

This application is a Divisional application under 35 U.S.C. 121 of U.S. patent application Ser. No. 16/238,926, filed on Jan. 3, 2019, entitled "Metal Contamination Reduction in Substrate Processing Systems With Transformer Couple Plasma", of which is incorporated herein by reference in its entirety.

FIELD OF THE DISCLOSURE

The present disclosure relates generally to substrate processing systems and more particularly to systems and methods for reducing metal contamination in substrate processing systems with transformer coupled plasma (TCP).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to perform treatments on substrates such as semiconductor wafers. Examples of substrate treatments include deposition, etching, cleaning and other processes. Etching usually includes either wet chemical etching or dry etching. Dry etching may be performed using plasma generated by inductively-coupled plasma (ICP). The inductively-coupled plasma may be generated by coils arranged outside of a processing chamber adjacent to a dielectric window. Process gas mixtures flowing inside the processing chamber are ignited to create plasma.

As feature sizes have grown smaller, semiconductor device performance has become increasingly sensitive to particle contamination. As a result, substrate processes define specific contamination limits. For example, processes may specify limitations on metal contamination. Metal contamination may cause performance degradation or other issues.

SUMMARY

A substrate processing system includes a processing chamber including a substrate support to support a substrate. A coil includes at least one terminal. An RF source configured to supply RF power to the coil. A dielectric window is arranged on one surface of the processing chamber adjacent to the coil. A contamination reducer includes a first plate that is arranged between the at least one terminal of the coil and the dielectric window.

In other features, the coil comprises an inner coil including a first conductor including first terminals and a second conductor including second terminals. An outer coil includes a third conductor including third terminals and a fourth conductor including fourth terminals.

In other features, a gas delivery system is configured to supply gas mixtures to the processing chamber. A gas injector is configured to deliver the gas mixtures to the processing chamber. The gas injector is arranged in a center portion of the dielectric window.

In other features, the first plate is arranged under one of the third terminals of the third conductor, one of the fourth terminals of the fourth conductor, and the first terminals of the first conductor. The contamination reducer further includes a second plate arranged under another one of the third terminals of the third conductor, another one of the fourth terminals of the fourth conductor, and the second terminals of the second conductor.

In other features, the first plate and the second plate have a rectangular shape. The first plate and the second plate have a barbell shape. The first plate and the second plate include ends and a middle portion.

In other features, the first plate is arranged under one of the third terminals of the third conductor and one of the fourth terminals of the fourth conductor. The contamination reducer further includes a second plate arranged under the first terminals of the first conductor, a third plate arranged under the second terminals of the second conductor, and a fourth plate arranged under another one of the third terminals of the third conductor and another one of the fourth terminals of the fourth conductor.

In other features, the first plate, the second plate, the third plate and the fourth plate have a shape selected from a group consisting of rectangular, polygonal, circular and elliptical. The first plate is made of a material selected from a group consisting of copper and aluminum. The first plate is made of silver-plated copper.

In other features, the inner coil and the outer coil are arranged in a range from 0.1" to 1.0" from the dielectric window. The inner coil and the outer coil are arranged in a range from 0.1" to 0.5" from the dielectric window. The inner coil and the outer coil are arranged at the same height above the dielectric window. The inner coil and the outer coil are arranged at different heights above the dielectric window. A thickness of the first plate is greater than or equal to 0.5 mm and less than or equal to 2 mm.

In other features, the dielectric window includes a coating material on a plasma-facing surface thereof. The contamination reducer reduces contamination of the substrate by species of the coating material. The coating material includes metal species and the contamination reducer reduces metal contamination of the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Substrate processing systems are typically used to etch thin film on substrates such as semiconductor wafers. The substrate processing systems include a processing chamber with a pedestal such as an electrostatic chuck (ESC) to support and hold a substrate during treatment. The processing chamber may include a dielectric window. Coils are arranged outside of the processing chamber adjacent to the dielectric window. Inductively-coupled plasma may be generated by supplying RF power to the coils using an RF generator. Process gas mixtures flowing inside the processing chamber are ignited to create plasma. For example only, the substrate processing system may be used to etch conductive film.

The coils are generally arranged in a plane that is located above and parallel to an outer surface of the dielectric window. RF power is delivered to the coils by conductive lines that connect to terminals located on ends of the coils. The conductive lines and terminals are connected generally perpendicular to the plane including the coils.

When excited by RF power, the coils produce strong magnetic fields that travel through the dielectric window and ignite the process gas mixture. In some examples, a magnetic field produced near the terminals of the coils may be higher or non-uniform relative to the field at other locations on the coils.

In some applications, an inner surface of the dielectric window is coated with a coating material including metal. For example, the coating material may include a material such as yttria (or yttrium oxide ($Y_2O_3$)), although other types of coating materials including other types of metal can be used. Metal contamination of the processing chamber or substrate may be caused by the ejection of metal atoms from the coating material in areas located below terminals of the coils. As the RF power is increased, the metal contamination typically increases. Metal contamination performance above 3 kW is typically unacceptable with metal contamination levels below systems running at lower RF power levels without the plates.

Systems and methods according to the present disclosure substantially reduce metal contamination by arranging one or more plates in regions directly below the terminals (between the coils and the dielectric window). In other words, the one or more plates block a line of sight between the terminals and the plasma in the processing chamber. Other portions of the coil that are not directly above the plates have a direct path through the dielectric window 124. In some examples, the one or more plates are made of a conducting material and are maintained at a floating potential (not grounded or biased). In some examples, the plates are made of copper, aluminum, or silver-coated copper, although other materials can be used.

In some examples, the plates are embedded in, arranged on and/or attached to the dielectric window or located in cavities formed on an upper surface of the dielectric window. In other examples, a gas plenum is arranged between the coils and the dielectric window and the one or more plates are attached to the gas plenum. In some examples, the systems and methods described herein sufficiently improve metal contamination performance to allow operation at RF power levels above 3 kW.

Figure 1:
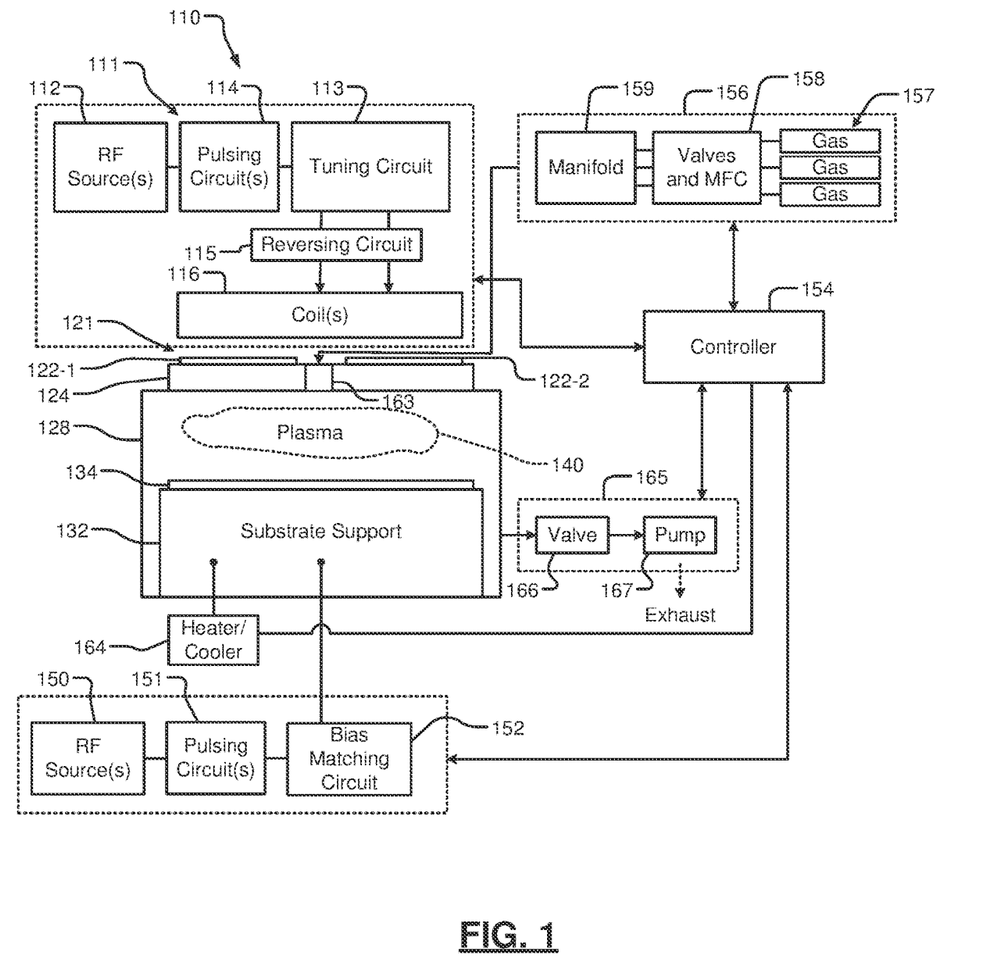
FIG. 1 is a functional block diagram of an example of an inductively coupled plasma (ICP) substrate processing system including plate arranged between a TCP coil and a dielectric window according to the present disclosure.

Referring now to FIG. 1, an example of a substrate processing system 110 according to the present disclosure is shown. The substrate processing system 110 includes a coil driving circuit 111. In some examples, the coil driving circuit 111 includes an RF source 112, a pulsing circuit 114, and a tuning circuit 113. The pulsing circuit 114 controls a TCP envelope of the RF signal and varies a duty cycle of TCP envelope between 1% and 99% during operation. As can be appreciated, the pulsing circuit 114 and the RF source 112 can be combined or separate.

The tuning circuit 113 may be directly connected to one or more inductive coils 116. Alternatively, the tuning circuits 113 may be connected by an optional reversing circuit 115 to one or more of the coils 116. The tuning circuit 113 tunes an output of the RF source 112 to a desired frequency and/or a desired phase, matches an impedance of the coils 116 and/or splits power between the coils 116. While examples including multiple coils are shown, a single coil including a single conductor or multiple conductors can be used. The reversing circuit 115 is used to selectively switch the polarity of current through one or more of the coils 116.

Examples of the reversing circuit 115 are shown and described in commonly assigned U.S. patent application Ser. No. 14/673,174 by Sato et al., titled "Systems And Methods For Reversing RF Current Polarity At One Output Of A Multiple Output RF Matching Network," filed Mar. 30, 2015, which is hereby incorporated by reference in its entirety.

A contamination reducer 121 reduces contamination of the substrate. For example, the contamination reducer 121 reduces contamination of the substrate by species (such as metal species) of a coating material on a plasma-facing side of the dielectric window 124. The contamination reducer 121 includes one or more plates (such as plates 122-1 and 122-2) that are arranged between terminals of the coils 116 and a dielectric window 124. The plates 122-1 and 122-2 act like an RF filter in areas near terminals of the coils 116. As a result, metal contamination is reduced. As the RF power increases, a coating (such as a yttria coating) on an inner surface of the dielectric window 124 is sputtered off— particularly in locations under the terminals where RF abnormalities or spikes may occur due to the terminals.

In some examples, the plates 122-1 and 122-2 are made of a material such as aluminum, copper or silver-coated copper. In some examples, the plates 122-1 and 122-2 have a thickness in a range from 0.5 mm to 2 mm, although other thicknesses can be used.

A dielectric window 124 is arranged along one side of a processing chamber 128. The processing chamber 128 further comprises a substrate support (or pedestal) 132 to support a substrate 134. The substrate support 132 may include an electrostatic chuck (ESC), or a mechanical chuck or other type of chuck. Process gas is supplied to the processing chamber 128 and plasma 140 is generated inside of the processing chamber 128. The plasma 140 etches an exposed surface of the substrate 134. An RF source 150, a pulsing circuit 151 and a bias matching circuit 152 may be used to bias the substrate support 132 during operation to control ion energy.

A gas delivery system 156 may be used to supply a process gas mixture to the processing chamber 128. The gas delivery system 156 may include process and inert gas sources 157, a gas metering system 158 such as valves and mass flow controllers, and a manifold 159. A gas injector 163 may be arranged at a center of the dielectric window 124 (or other location and is used to inject gas mixtures from the gas delivery system 156 into the processing chamber 128.

A heater/cooler 164 may be used to heat/cool the substrate support 132 to a predetermined temperature. An exhaust system 165 includes a valve 166 and pump 167 to control pressure in the processing chamber and/or to remove reactants from the processing chamber 128 by purging or evacuation.

A controller 154 may be used to control the etching process. The controller 154 monitors system parameters and controls delivery of the gas mixture, striking, maintaining and extinguishing the plasma, removal of reactants, supply of cooling gas, and so on. Additionally, as described below in detail, the controller 154 may control various aspects of the coil driving circuit 111, the RF source 150, and the bias matching circuit 152, etc.

Figure 2:
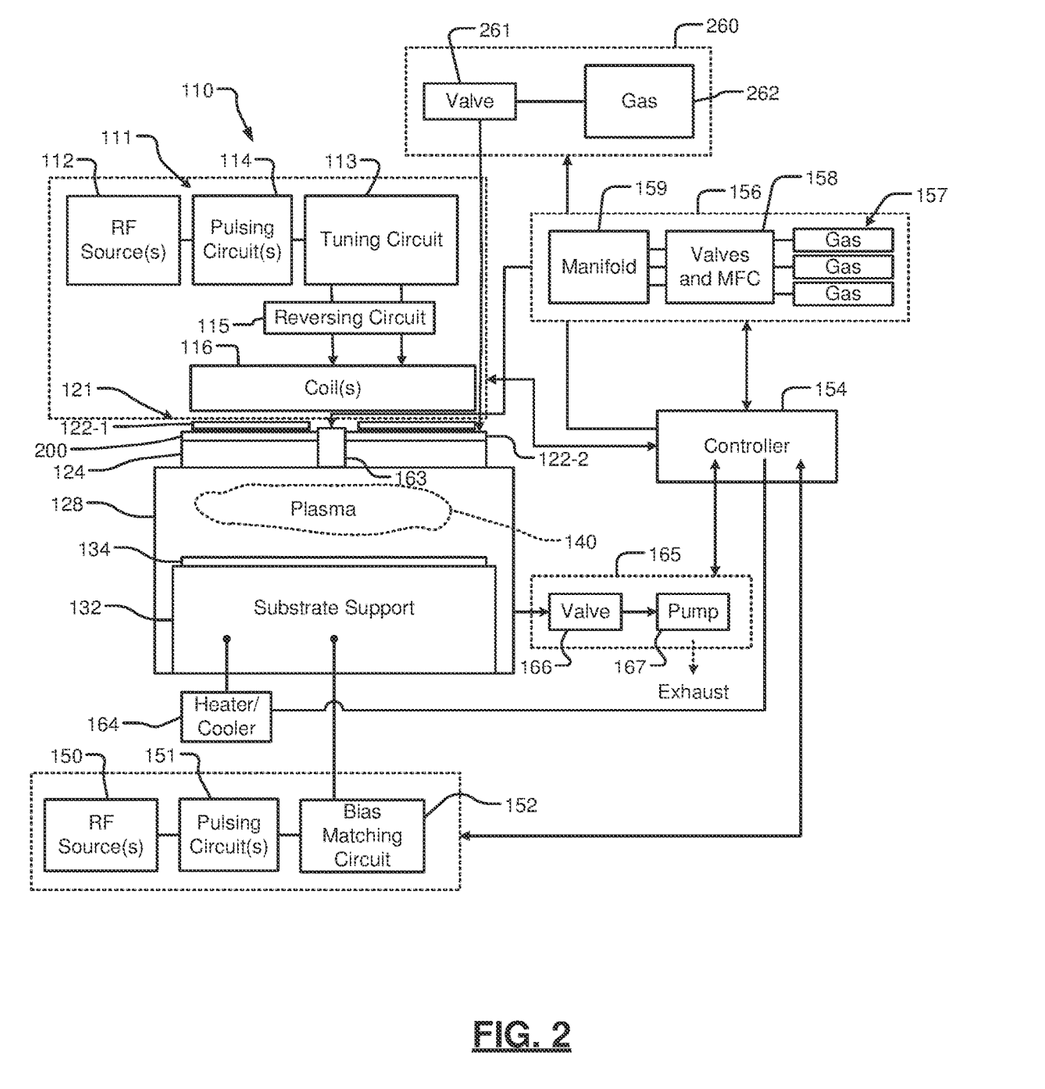
FIG. 2 is a functional block diagram of another example of an inductively coupled plasma (ICP) substrate processing system including plate arranged between a TCP coil and a dielectric window according to the present disclosure.

Referring now to FIG. 2, the substrate processing system of FIG. 1 may include a plenum 220 that is arranged between the coils 116 and the dielectric window 124 to control a temperature of the dielectric window 124. The plenum 220 directs gas such as air or an inert gas that is heated or cooled. A gas delivery system 260 may be used to deliver gas 262 via a valve 261 to the plenum 220. The gas may include cooling gas (air) that is used to cool the coils 116 and the dielectric window 124. The plenum 220 may also use liquid cooling.

Figure 3A:
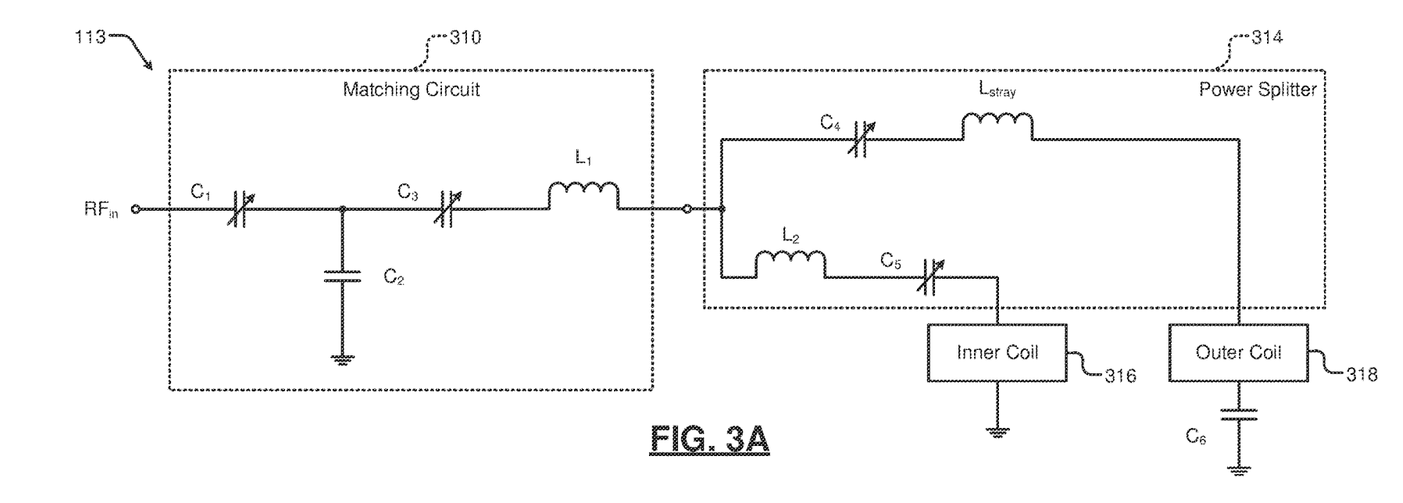
FIGS. 3A and 3B are electrical schematics of examples of tuning circuits according to the present disclosure.
Figure 3B:
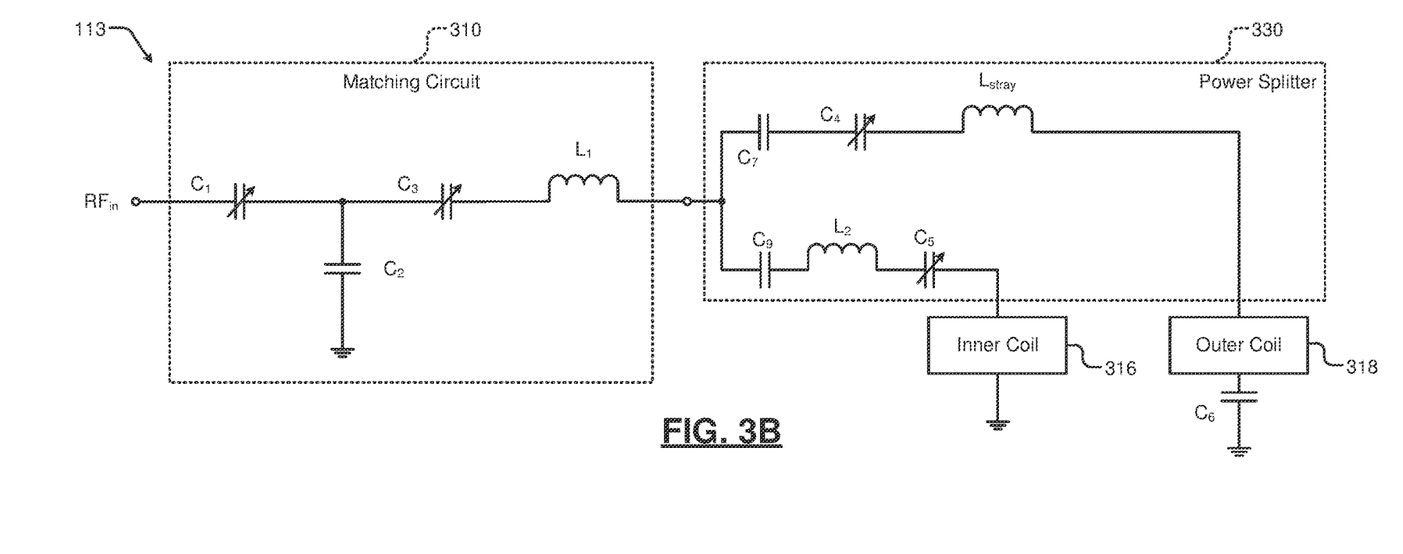

Referring now to FIGS. 3A and 3B, examples of tuning circuits 113 including networks of interconnected capacitors and inductors are shown. While specific examples are shown, other arrangements can be used. In FIG. 3A, the tuning circuit 113 includes a matching circuit 310 with variable capacitors $C_1$ and $C_3$ and an inductor $L_1$ that are connected in series. A capacitor $C_2$ is connected in parallel to a node between the variable capacitors $C_1$ and $C_3$. A power splitting circuit 314 includes a series-connected inductor $L_2$ and variable capacitor $C_5$ connected to the inductor $L_1$ at one end and to an inner coil 316 at the other end. An outer coil 318 is connected to the inductor $L_1$ by variable capacitor $C_4$ and stray inductance $L_{stray}$.

In FIG. 3B, additional capacitors can be added to a power splitting circuit 330 of the tuning circuit 113. A capacitor $C_7$ is connected between the inductor $L_1$ and the variable capacitor $C_4$. A capacitor $C_9$ is arranged between the inductor $L_1$ and the inductor $L_2$.

Figure 4A:
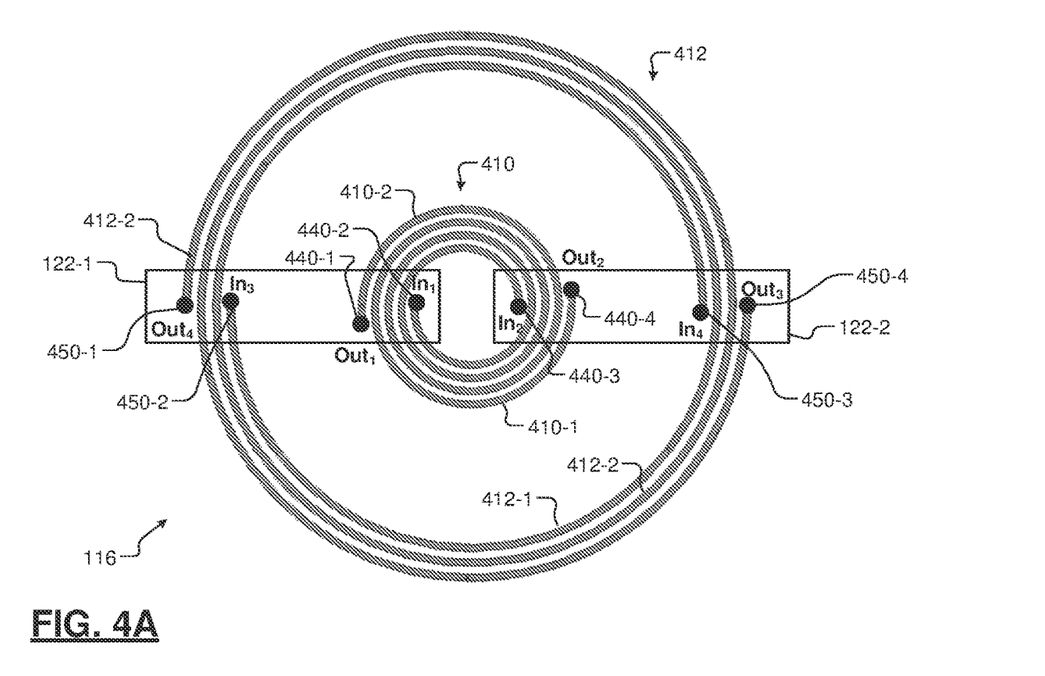
FIGS. 4A to 4E are plan views of examples of plates arranged relative to inner and outer coils according to the present disclosure.

Referring now to FIGS. 4A to 4E, example arrangements of coils and plates are shown. In FIG. 4A, an arrangement of the coils 116 and the plates 122-1 and 122-2 are shown. The coils 116 may include an inner coil 410 and an outer coil 412. The inner coil 410 includes a first conductor 410-1 having an input end $In_1$ and an output end $Out_1$ and a second conductor 410-2 having an input end $In_2$ and an output end $Out_2$. The first conductor 410-1 and the second conductor 410-2 are wound in a generally circular or looped path adjacent to each other in an overlapping manner. In this example, the conductors 410-1 and 410-2 of the inner coil 410 have 2 turns, although other numbers of turns can be used. While the examples of coils are terminated to ground or by a capacitance or inductance to ground in this disclosure, in other examples, one end of the coil may be floating and the coil acts as an antenna.

The outer coil 412 includes a first conductor 412-1 having an input end $In_3$ and an output end $Out_3$ and a second conductor 412-2 having an input end $I_4$ and an output end $Out_4$. The first conductor 412-2 and the second conductor 412-2 are wound in a generally circular or looped path adjacent to each other in an overlapping manner (similar to the inner coil described above). In this example, the conductors 412-1 and 412-2 of the outer coil 412 have 1.5 turns, although other numbers of turns can be used.

The plates 122-1 and 122-2 of the contamination reducer 121 are generally rectangular in shape and are arranged below terminal connections 440-1, 440-2, 440-3 and 440-4 (collectively terminal connections 440) of the inner coils 410 and 450-1, 450-2, 450-3 and 450-4 (collectively terminal connections 450) of the outer coils 412. In some examples, the terminal connections 440 and 450 transition from a generally horizontal coil to a generally vertical conductive line (not shown). In particular, the plate 122-1 is located below the terminals 450-1 and 450-2 and the terminals 440-1 and 440-2. The plate 122-2 is located below the terminals 440-3 and 440-4 and the terminals 450-3 and 450-4.

Figure 4B:
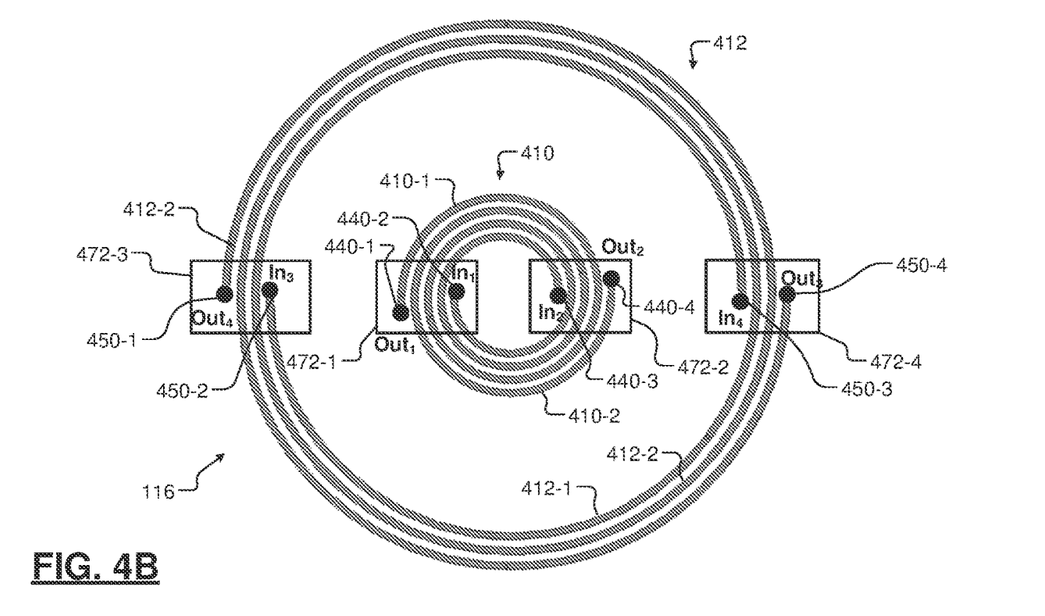
Figure 4C:
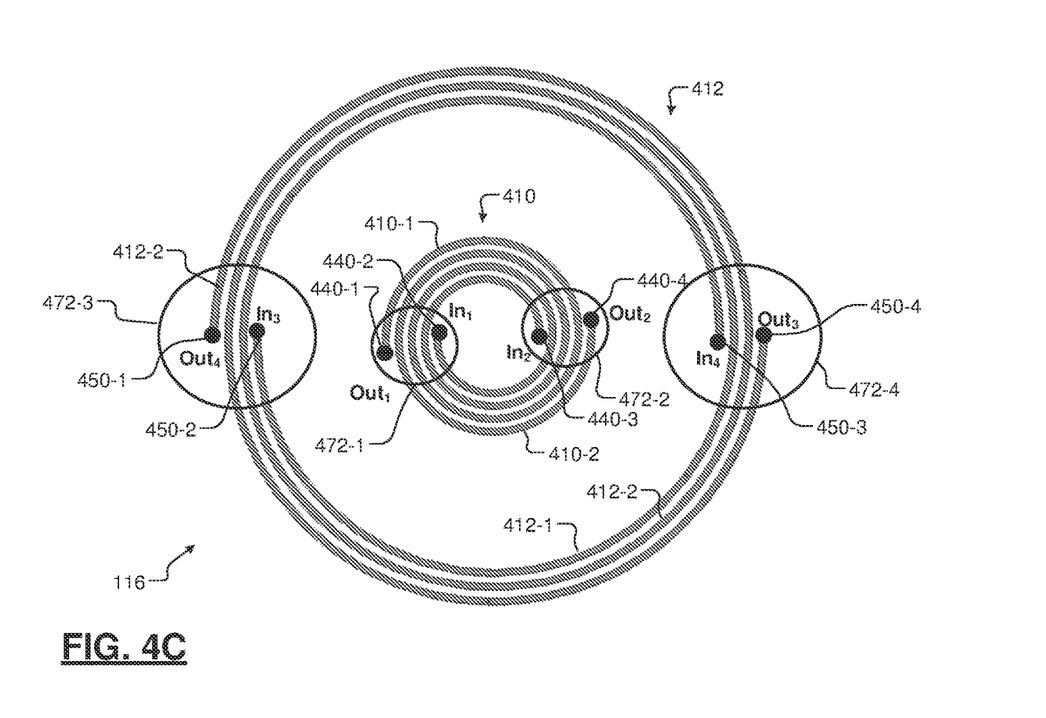

In FIGS. 4B and 4C, plates 472-1, 472-2, 472-3 and 472-4 are generally rectangular (or polygonal) (FIG. 4B), circular (or elliptical) (FIG. 4C) or other shape and are arranged below terminal connections 440-1, 440-2, 440-3 and 440-4 of the inner coils 410 and 450-1 and 450-2, and 450-3 and 450-4 of the outer coils 412. The plate 472-1 is located below the terminals 440-1, 440-2 of the inner coils 410 and the plate 472-2 is located below the terminals 440-3 and 440-4 of the inner coils 410. The plate 472-3 is located below the terminals 450-1, 450-2 of the outer coils 412 and the plate 472-4 is located below the terminals 450-3 and 450-4 of the outer coils 412. In some examples, the circular plates have a diameter that is 5 to 20 times a diameter of a terminal connection. In other examples, the circular plates have a diameter that is 5 to 10 times a diameter of a terminal connection.

Figure 4D:
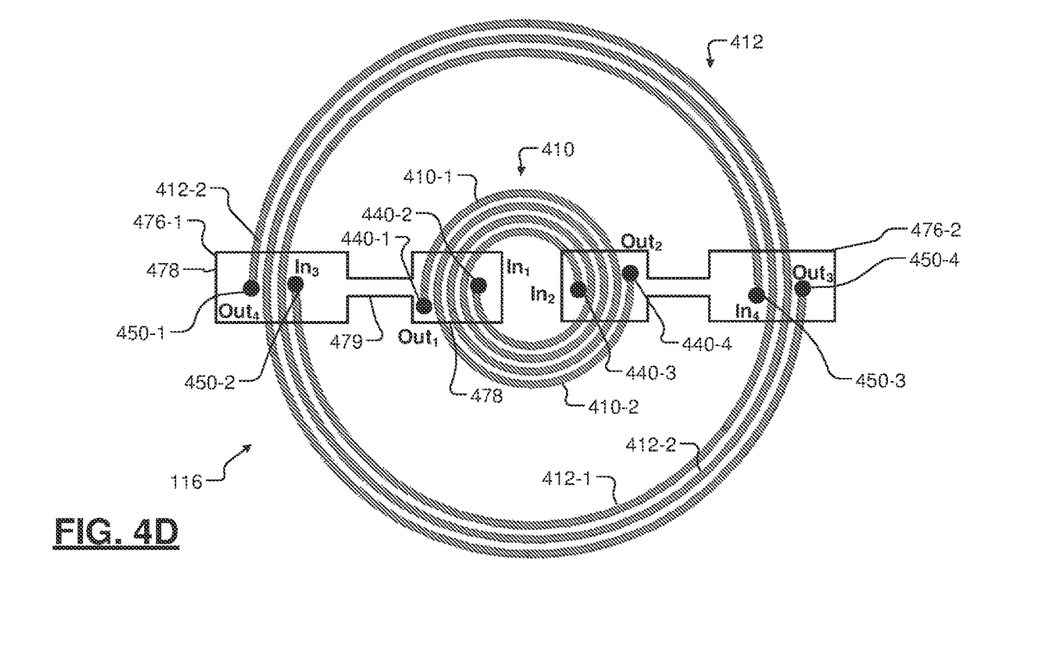
Figure 4E:
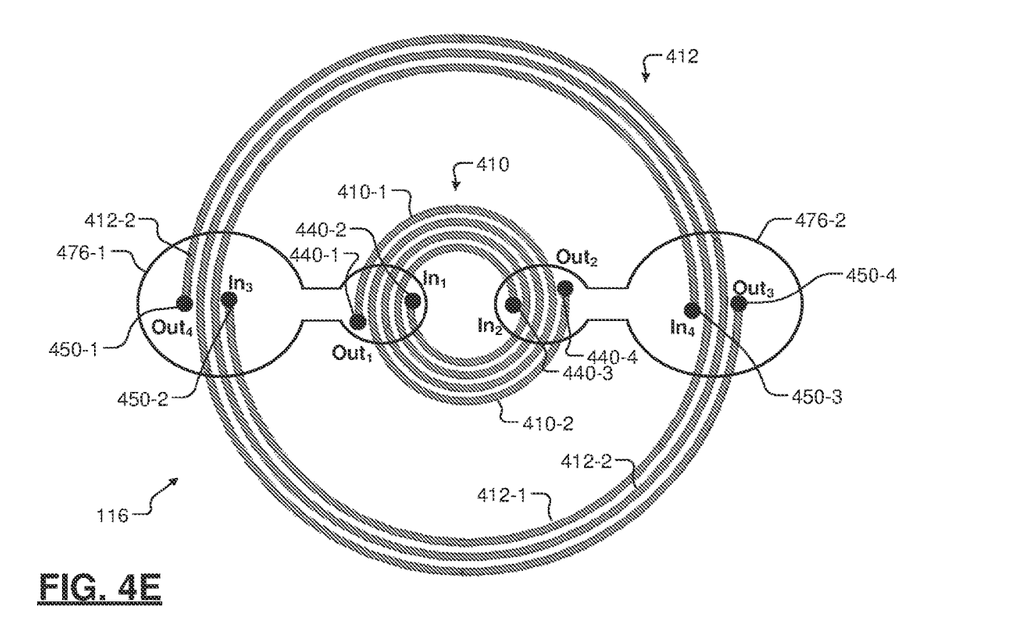

In FIGS. 4D and 4E, plates 476-1 and 476-2 have a "barbell"-like shape with end portions 478 and a middle connecting portion 479. In some examples, the end portions 478 have a rectangular shape (FIG. 4C), or circular or elliptical shape (FIG. 4D). The end portions 487 are arranged below terminal connections 440-1, 440-2, 440-3 and 440-4 of the inner coils 410 and 450-1, 450-2, 450-3 and 450-4 of the outer coils 412. In particular, the plate 476-1 is located below the terminals 450-1 and 450-2 and the terminals 440-1 and 440-2. The plate 476-2 is located below the terminals 440-3 and 440-4 and the terminals 450-3 and 450-4.

Figure 5:
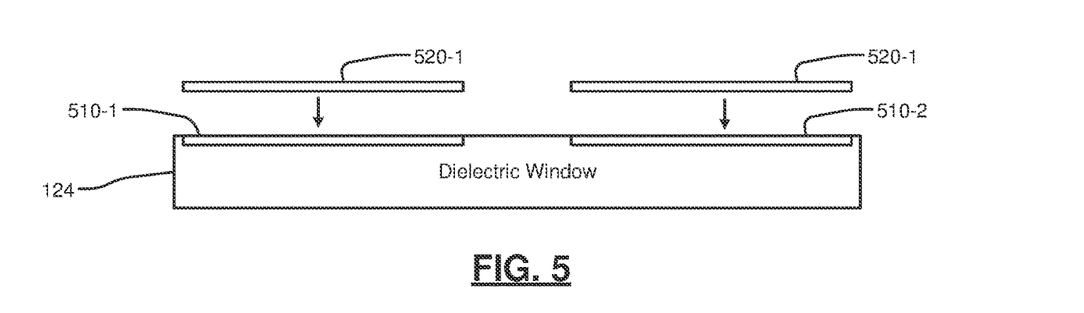
FIG. 5 is a side cross-sectional view of the dielectric window including one or more slots configured to receive the one or more plates.

Referring now to FIG. 5, the dielectric window 124 includes cavities 510-1 and 510-2 arranged in a coil-facing surface of the dielectric window 124. The cavities 5-1 and 510-2 are sized to receive plates 520-1 and 520-2, respectively. In some examples, the cavities 510-1 and 510-2 have a depth that is greater than ½ of a thickness of the plates 520-1 and 520-1.

Figure 6:
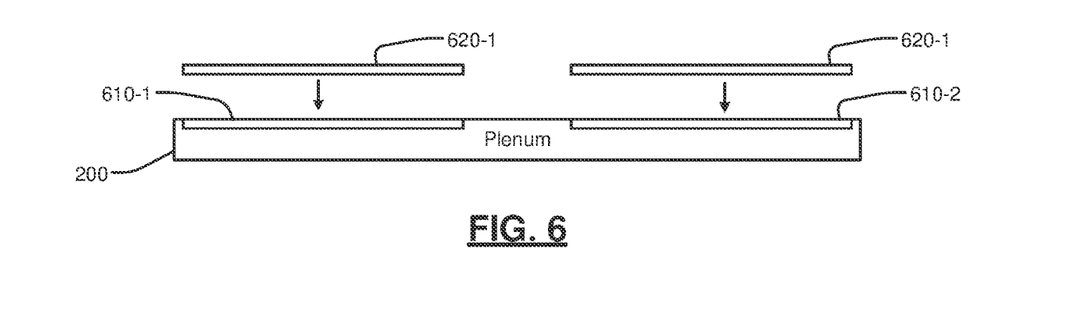
FIG. 6 is a side cross-sectional view of the plenum including one or more slots configured to receive the one or more plates.

Referring now to FIG. 6, the plenum 220 includes cavities 610-1 and 610-2 arranged in a coil-facing surface of the plenum 220. The cavities 610-1 and 610-2 are sized to receive plates 520-1 and 520-2, respectively. In some examples, the cavities 610-1 and 610-2 have a depth that is greater than ½ of a thickness of the plates 520-1 and 520-1.

In some examples, the inner and outer coils are arranged at the same distance from the dielectric window. In other examples, one of the inner and outer coils is arranged higher than the other of the inner and outer coils. For example, the inner coil can be arranged at a first height and the outer coil can be arranged at a second height such as one-half to twice the first height. In some examples, the coils are arranged in a range from 0.1" to 1.0" from the dielectric window. In other examples, the coils are arranged in a range from 0.1" to 0.5" from the dielectric window. In other examples, one of the coils is arranged at 0.4" and the other one of the coils is arranged at 0.8" from the dielectric window. For example, the outer coil can be arranged at 0.8" and the inner coil can be arranged at 0.4".

In some examples, the plates have a thickness that is greater than a skin depth at the RF frequency (e.g. 13.56 MHz) that is used and less than a thickness that would short the turns of the coil. In some examples, the thickness of the plates is greater than or equal to 0.5 mm and less than or equal to 2 mm.

Using the designs shown above, metal contamination was reduced by in a range from over 50% to 90% as compared to the same design without the plate. As can be appreciated, the systems and methods described herein allow operation at higher power (3 kW to 6 kW) with metal contamination levels equivalent to or less than operation without the plate(s) at lower power levels up to 3 kW. The higher RF power levels provide improved etch rates, which increases throughput and reduces cost.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system, comprising:
   a processing chamber including a substrate support to support a substrate;
   an inner coil including a first conductor including first terminals and a second conductor including second terminals;
   an outer coil including a third conductor including third terminals and a fourth conductor including fourth terminals;
   an RF source configured to supply RF power to the inner and outer coils;
   a dielectric window arranged on one surface of the processing chamber adjacent to the inner and outer coils; and
   a plurality of contamination reducers for reducing contamination of the substrate, including:
      a first plate arranged between the dielectric window and a first one of the third terminals of the third conductor, and a first one of the fourth terminals of the fourth conductor,
      a second plate arranged between the dielectric window and a first one of the first terminals of the first conductor;
      a third plate arranged between the dielectric window and a second one of the third terminals of the third conductor, and a second one of the fourth terminals of the fourth conductor, and
      a fourth plate arranged between the dielectric window and the second terminals of the second conductor;
   wherein each of the first plate, the second plate, the third plate and the fourth plate have a rectangular shape.

2. The substrate processing system of claim 1, further comprising a gas delivery system configured to supply gas mixtures to the processing chamber.

3. The substrate processing system of claim 1, further comprising a gas injector configured to deliver the gas mixtures to the processing chamber, wherein the gas injector is arranged in a center portion of the dielectric window.

4. The substrate processing system of claim 1, wherein the first plate, the second plate, the third plate, and the fourth plate are each made of a material selected from a group consisting of copper or aluminum.

5. The substrate processing system of claim 1, wherein the first plate, the second plate, the third plate, and the fourth plate are each made of silver-plated copper.

6. The substrate processing system of claim 1, wherein the inner coil and the outer coil are arranged in a range from 0.1" to 1.0" from the dielectric window.

7. The substrate processing system of claim 1, wherein the inner coil and the outer coil are arranged in a range from 0.1" to 0.5" from the dielectric window.

8. The substrate processing system of claim 1, wherein the inner coil and the outer coil are arranged at the same height above the dielectric window.

9. The substrate processing system of claim 1, wherein the inner coil and the outer coil are arranged at different heights above the dielectric window.

10. The substrate processing system of claim 1, wherein a thickness of the first plate and the second plate is greater than or equal to 0.5 mm and less than or equal to 2 mm.

11. The substrate processing system of claim 1, wherein:
   the dielectric window includes a coating material on a plasma-facing surface thereof, and
   the contamination reducer reduces contamination of the substrate by species of the coating material.

12. The substrate processing system of claim 11, wherein the coating material includes metal species and wherein the contamination reducer reduces metal contamination of the substrate.

* * * * *